United States Patent
Su et al.

(10) Patent No.: US 9,042,019 B2
(45) Date of Patent: May 26, 2015

(54) ANTI-REFLECTIVE LENSES AND METHODS FOR MANUFACTURING THE SAME

(71) Applicant: QSpex Technologies, Inc., Alpharetta, GA (US)

(72) Inventors: Kai C. Su, Alpharetta, GA (US); Leslie F. Stebbins, Roswell, GA (US); Bill Mantch, Smyrna, GA (US); Eugene C. Letter, Webster, NY (US)

(73) Assignee: QSPEX TECHNOLOGIES, INC., Alpharetta, GA (US)

( * ) Notice: Subject to any disclaimer, the term of this patent is extended or adjusted under 35 U.S.C. 154(b) by 50 days.

(21) Appl. No.: 13/648,642

(22) Filed: Oct. 10, 2012

(65) Prior Publication Data

US 2013/0033753 A1 Feb. 7, 2013

Related U.S. Application Data

(63) Continuation-in-part of application No. 13/088,199, filed on Apr. 15, 2011, now abandoned.

(51) Int. Cl.
*B82Y 30/00* (2011.01)
*B82Y 40/00* (2011.01)

(52) U.S. Cl.
CPC .................. *G02B 1/115* (2013.01); *B82Y 30/00* (2013.01); *B82Y 40/00* (2013.01)

(58) Field of Classification Search
CPC ............ G02B 1/10; G02B 1/105; G02B 1/11; G02B 1/111; G02B 1/113; G02B 1/115
USPC ......... 249/117–174, 187.1–204; 264/1.1–2.7; 351/159.01, 159.49, 159.55, 159.57, 351/159.6, 159.62, 159.63, 159.64, 159.65, 351/159.73; 359/577–590, 642, 722, 723, 359/738

See application file for complete search history.

(56) References Cited

U.S. PATENT DOCUMENTS

| 4,615,947 A | 10/1986 | Goossens |
| 5,025,049 A | 6/1991 | Takarada |

(Continued)

FOREIGN PATENT DOCUMENTS

| CN | 101724342 A | 6/2010 |
| JP | 2007-504500 A | 3/2007 |

OTHER PUBLICATIONS

Arkles et al, Cyclic azasilanes: volatile coupling agents for nanotechnology, Silanes and Other Coupling Agents, vol. 3, pp. 179-191 [2004].*

(Continued)

*Primary Examiner* — Stephone B Allen
*Assistant Examiner* — Kimberly N Kakalec
(74) *Attorney, Agent, or Firm* — Morris, Manning & Martin, LLP; Tim Tingkang Xia, Esq.

(57) ABSTRACT

The present invention relates to a method of applying an anti-reflective coating to an optical surface of a mold. In one embodiment, the method includes the steps of: providing a lens mold having an optical surface; forming a layer of a super hydrophobic material with a thickness of about 30 to 40 nm over the optical surface, wherein the super hydrophobic material contains dipodal silane; forming an anti-reflective coating layered structure over the layer of the super hydrophobic material; and forming a layer of a cyclic azasilane coupling agent that is deposited with a monolayer thickness to the anti-reflective coating layered structure using vapor deposition or by dip coating using a solution of cyclic azasilane coupling agent in an aprotic solvent.

24 Claims, 6 Drawing Sheets

(56) References Cited

U.S. PATENT DOCUMENTS

| | | | |
|---|---|---|---|
| 5,096,626 A | 3/1992 | Takamizawa et al. | |
| 5,733,483 A | 3/1998 | Soane et al. | |
| 6,150,430 A | 11/2000 | Walters et al. | |
| 6,250,758 B1* | 6/2001 | Yoshihara et al. | 351/159.63 |
| 6,986,857 B2 | 1/2006 | Klemm et al. | |
| 2003/0122269 A1 | 7/2003 | Weber et al. | |
| 2003/0129397 A1* | 7/2003 | Wilson et al. | 428/375 |
| 2004/0065968 A1* | 4/2004 | Klemm et al. | 264/2.5 |
| 2005/0233070 A1* | 10/2005 | Pellerite et al. | 427/164 |
| 2006/0012889 A1 | 1/2006 | Kojima et al. | |
| 2006/0079388 A1 | 4/2006 | Koenig et al. | |
| 2006/0176571 A1 | 8/2006 | Mosse et al. | |
| 2008/0113188 A1 | 5/2008 | Shah et al. | |
| 2009/0075092 A1 | 3/2009 | Varaprasad | |
| 2012/0107581 A1* | 5/2012 | Simpson et al. | 428/203 |

OTHER PUBLICATIONS

International Search Report, Korean Intellectual Property Office (KIPO), Apr. 25, 2013.
Written Opinion of the International Searching Authority, Korean Intellectual Property Office (KIPO), Apr. 25, 2013.
Korean Intellectual Property Office (ISR/KR), "International Search Report and Written Opinion", PCT/US2014/038600, Korea, Sep. 26, 2014.

* cited by examiner

Structure 1. Cyclic Azasilane N-n-BUTYL-AZA-2,2-DIMETHOXY SILACYCLOPENTANE

+

Structure 2

SiO₂ Surface

Ring opening reaction
(no water or heat required)

SiO₂ Surface

Structure 3

ANTI-REFLECTIVE LENSES AND METHODS FOR MANUFACTURING THE SAME

CROSS-REFERENCE TO RELATED APPLICATIONS

This application is a continuation-in-part of U.S. patent application Ser. No. 13/088,199, filed Apr. 15, 2011, entitled "ANTI-REFLECTIVE LENSES AND METHODS FOR MANUFACTURING THE SAME" by Kai C. Su, Leslie F. Stebbins, Bill Mantch, and Eugene C. Letter. The disclosure of the above identified co-pending application is incorporated herein by reference in its entirety.

Some references, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference were individually incorporated by reference.

FIELD OF THE INVENTION

The present invention relates generally to an optical surface, and more particularly to an anti-reflective lens and methods of manufacturing the same.

BACKGROUND OF THE INVENTION

An anti-reflective lens normally is formed with an anti-reflective coating on a plastic ophthalmic lens. Anti-reflective (AR) coatings are applied to the surfaces of ophthalmic lenses and other optical devices to reduce reflection. For ophthalmic lenses in particular, the reduced reflection makes them not only look better, but more importantly work better because they produce less glare by eliminating multiple reflections, which is particularly noticeable when driving at night or working in front of a computer monitor. The decreased glare means that wearers often find their eyes are less tired, particularly at the end of the day. AR coatings also allow more light to pass through the lens, which increases contrast and therefore increases visual acuity.

The art of casting plastic ophthalmic lenses involves introducing a lens-forming material between two molds and then polymerizing the lens-forming material to become a solid. Liquid plastic formulations such as CR39 monomer are injected into a cavity formed by front and rear molds which have been provided with interior polished mold surfaces for the finished surfaces of the lenses. The plastic is cured in the mold, and then the mold is separated to yield a completed ophthalmic lens which meets a selected prescription. The lens is then ground around the edge to fit into the selected frame. Coatings can be applied to the finished lens or to the inside of the front or rear mold, whereupon they will bond to the lens upon curing.

Some optometrists offer on-site eyeglass services. Several companies have developed methods by which lenses can be cast on site, in an office. However, current methods of applying AR coatings to eyeglasses require that they be shipped to a different facility because the AR coatings must be applied via vacuum vapor deposition. This of course means additional time and expense. There is therefore a need for a method for making eyeglasses with an AR coating on-site.

One type of AR coating that is used for ophthalmic lenses is an alternating stack of a high index material and a low index material. The most commonly used low index material is silicon dioxide; zirconium dioxide and/or titanium dioxide is often used as the high index material.

An issue with AR coatings, particularly as applied to plastic ophthalmic lenses, is adhesion. AR coatings are generally applied via vacuum deposition. It is well known that adhesion of vacuum-deposited coatings to their substrates is in general problematic. The organic, plastic lens material and inorganic AR material do not readily adhere to each other, resulting in peeling or scratching. Accordingly, a new method is needed to apply an AR coating to a plastic lens with greater adhesion.

Several patents are understood to disclose using silanes to bind an inorganic matrix to an organic matrix. U.S. Pat. No. 5,733,483 to Soane et al. teaches using a coupling layer to tie together an AR multilayer made of silicon oxide and an acrylate-containing lens. The coupling agent has a siloxy head and an acrylate tail. An example of a silane used therein is methacryloxypropyltrimethoxysilane.

U.S. Pat. No. 4,615,947 to Goosens teaches an acrylic mixed with an organopolysiloxane to increase the adhesion of an organosiloxane hard coat to a thermoplastic substrate, U.S. Pat. No. 5,025,049 to Takarada et al. also teaches a primer for increasing adhesion of an organopolysiloxane layer to a thermoplastic substrate. The primer is a mixture of an organic copolymer including an alkoxysilylated monomer and other ingredients.

Other patents discuss using silanes to bind an organic matrix to another organic matrix. U.S. Pat. No. 6,150,430 to Walters et al. teaches using organofunctional silanes to improve the adherence of an organic polymeric layer to an organic polymeric substrate.

U.S. Pat. No. 5,096,626 to Takamizawa et al. teaches a plastic lens having an AR coating and/or hard coat. The patent discusses poor adhesion of prior art methods and says they achieve excellent adhesion by forming the lens using a set of molds, wherein the AR coating is first applied to one of the molds and then the lens monomer is poured between the molds and polymerized. A silane coupling agent such as methacryloxypropyltrimethoxysilane can be included in the hard coat/AR coat solution, which may contain colloidal silica, colloidal antimony oxide or colloidal titanium dioxide.

U.S. Pat. No. 6,986,857 to Klemm et al. teaches a method of assembling a lens with a top coat, AR coat, scratch resistant coat, impact resistant primer, and lens substrate. Klemm's solution to the issue of poor adherence of the top coat to the AR coat is to apply the first layer of the AR coating (which comprises a stack of four layers) as two sublayers of $SiO_2$. Another thin layer of $SiO_2$ is applied between the AR stack and the scratch resistant coating to improve adherence between the two.

The above references in general use sol gel chemistry and require high heat ($\geq 80°$ C.). Heating to high temperature, however, is not suitable for casting and curing lenses in plastic molds because the optical surface of the mold will be distorted.

Therefore, a heretofore unaddressed need exists in the art to address the aforementioned deficiencies and inadequacies.

SUMMARY OF THE INVENTION

In one aspect, the present invention relates to a method of applying an AR coating to a plastic substrate such as a plastic ophthalmic lens where the AR coating exhibits good adhesion to the substrate, wherein the method is practiced avoiding high or elevated temperatures. A novel aspect of this invention is the use of dipodal silanes in super hydrophobic coatings. Unexpectedly, it has been discovered that use of an effective amount of dipodal silane in a super hydrophobic coating on the lens mold makes the AR coating stable. If no or too little dipodal silane is used, the AR coating crazes either on the mold or on the lenses.

In another aspect of this invention which will be described in further detail herein, a layer of a cyclic azasilane coupling agent is applied to the AR-coated mold to promote adhesion of the hard coating. It is believed that it is the first time in the industry, and only by the inventive discovery of the present invention, that cyclic azasilanes are utilized in non-aqueous optical lens forming processes as coupling agents.

Employing the aforementioned features, the present invention relates to a practical and economically viable method of on-site manufacturing of a plastic ophthalmic lens, particularly a spectacle lens having an AR coating.

In one aspect, the present invention relates to a method of applying an anti-reflective coating to an optical surface of a mold. In one embodiment, the method includes the steps of providing a lens mold having an optical surface; forming a deposition layer of a fluoride or oxide material to the optical surface of the lens mold; forming a layer of a hydrophobic material over the deposition layer, wherein the hydrophobic material contains an amount of dipodal silane that is a relative percentage of the hydrophobic material; forming a first layer of $SiO_2$ with a thickness of about 5 to 40 nm over the layer of the hydrophobic material; forming an anti-reflective coating layered structure over the first layer of $SiO_2$; and forming a layer of a silane coupling agent that is deposited with a monolayer thickness to the anti-reflective coating layered structure, by vapor deposition under aprotic conditions or by dip coating using a solution of a silane coupling agent in an aprotic solvent.

In one embodiment, the deposition layer is adapted to provide temporary adhesion between the mold surface and the hydrophobic layer such that all subsequent layers remain adherent to one another. The deposition layer is formed of LiF, $MgF_2$, $CaF_2$, $SrF_2$, $BaF_2$, $LaF_3$, $CeF_3$, $HfF_4$, $NdF_4$, $SiO_2$, $ZrO_2$, $Al_2O_3$, $Cr_2O_3$, $HfO_2$, $In_2O_3$, $Ta_2O_5$, $TiO_2$, $Y_2O_3$, or a combination of them. Preferably, the deposition layer is formed of $MgF_2$ using ion assist and has a thickness of about 45 nm.

In one embodiment, the hydrophobic layer is a super hydrophobic layer with a thickness of about 30 to 40 nm and the amount of the dipodal silane is about 1.7-8.3% of said super hydrophobic material by weight.

In one embodiment, the step of forming the anti-reflective coating layered structure over the layer of a super hydrophobic material can be performed with the steps of forming a second layer of $SiO_2$ that is deposited using ion assist and with a thickness of about 5 to 100 nm to the first layer of $SiO_2$; forming a first layer of $ZrO_2$ with a thickness of about 40 to 50 nm to the second layer of $SiO_2$; forming a third layer of $SiO_2$ that is deposited using ion assist and with a thickness about 10 to 20 nm to the first layer of $ZrO_2$; forming a second layer of $ZrO_2$ with a thickness of about 50 to 70 nm to the third layer of $SiO_2$; forming a fourth layer of $SiO_2$ that is deposited using ion assist and with a thickness of about 25 to 40 nm to the second layer of $ZrO_2$; forming a third layer of $ZrO_2$ with a thickness of about 10 to 25 nm to the fourth layer of $SiO_2$; and forming a fifth layer of $SiO_2$ that is deposited using ion assist and with a thickness of about 5 to 15 nm to the third layer of $ZrO_2$.

In one embodiment, the dipodal silane can be bis (trimethoxysilylpropyl) amine.

In one embodiment, the layer of the coupling agent is formed of a composition that comprises cyclic azasilanes. In one particular embodiment, the layer of coupling agent is formed of N-n-butyl-aza-2,2-dimethoxy-silacyclopentane.

In another aspect, the present invention relates to a mold with an optical surface having an anti-reflective coating that is transferable to an optical surface of a lens. In various embodiments, such a mold has a deposition layer of a fluoride or oxide material deposited to the optical surface; a layer of a hydrophobic material over the deposition layer wherein the hydrophobic material contains an amount of dipodal silane that is a relative percentage of the hydrophobic material; a first layer of $SiO_2$ that is deposited without using ion assist and with a thickness of about 5 to 40 nm deposited to the layer of the hydrophobic material; an anti-reflective coating layered structure deposited over the first layer of $SiO_2$; and a layer of a silane coupling agent with a monolayer thickness deposited over the anti-reflective coating layered structure by vapor deposition or by dip coating using a solution of a silane coupling agent in an aprotic solvent.

In one embodiment, the deposition layer is adapted to provide temporary adhesion between the mold surface and the hydrophobic layer such that all subsequent layers remain adherent to one another. The deposition layer is formed of LiF, $MgF_2$, $CaF_2$, $SrF_2$, $BaF_2$, $LaF_3$, $CeF_3$, $HfF_4$, $NdF_4$, $SiO_2$, $ZrO_2$, $Al_2O_3$, $Cr_2O_3$, $HfO_2$, $In_2O_3$, $Ta_2O_5$, $TiO_2$, $Y_2O_3$, or a combination of them. Preferably, the deposition layer is formed of $MgF_2$ using ion assist and has a thickness of about 45 nm.

In one embodiment, the hydrophobic layer is a super hydrophobic layer with a thickness of about 30 to 40 nm and the amount of the dipodal silane is about 1.7-8.3% of said super hydrophobic material by weight.

In one embodiment, the anti-reflective coating layered structure includes a second layer of $SiO_2$ that is deposited using ion assist and with a thickness of about 5 to 100 nm to the first layer of $SiO_2$; a first layer of $ZrO_2$ with a thickness of about 40 to 50 nm deposited to the second layer of $SiO_2$; a third layer of $SiO_2$ that is deposited using ion assist and with a thickness about 10 to 20 nm to the first layer of $ZrO_2$; a second layer of $ZrO_2$ with a thickness of about 50 to 70 nm deposited to the third layer of $SiO_2$; a fourth layer of $SiO_2$ that is deposited using ion assist and with a thickness of about 25 to 40 nm to the second layer of $ZrO_2$; a third layer of $ZrO_2$ with a thickness of about 10 to 25 nm deposited to the fourth layer of $SiO_2$; and a fifth layer of $SiO_2$ that is deposited using ion assist and with a thickness of about 5 to 15 nm to the third layer of $ZrO_2$.

In one embodiment, the dipodal silane can be bis (trimethoxysilylpropyl) amine.

In one embodiment, the layer of coupling agent is formed of a composition that comprises cyclic azasilanes. In various embodiments, the layer of coupling agent is formed of N-n-butyl-aza-2,2-dimethoxy-silacyclopentane.

In a further aspect, the present invention relates to an optical lens. The optical lens has a lens body with an optical surface, a hard coat layer over the optical surface, and an anti-reflective coating formed on the hard coating, where in various embodiments, the anti-reflective coating has a layer of a silane coupling agent with a monolayer thickness over the hard coat layer; an anti-reflective coating layered structure over the layer of the silane coupling agent; a first layer of $SiO_2$ that is deposited without using ion assist and with a thickness of about 5 to 40 nm over the anti-reflective coating layered structure over the layer of a coupling agent; and a layer of a hydrophobic material with a thickness of about 30 to 40 nm over the first layer of $SiO_2$, wherein the hydrophobic material contains dipodal silane.

In one embodiment, the hydrophobic layer is a super hydrophobic layer with a thickness of about 30 to 40 nm and the amount of the dipodal silane is about 1.7-8.3% of said super hydrophobic material by weight.

In one embodiment, the dipodal silane can be bis (trimethoxysilylpropyl) amine.

In one embodiment, the layer of coupling agent is formed of a composition that comprises cyclic azasilanes. In various embodiments, the layer of coupling agent is formed of N-n-butyl-aza-2,2-dimethoxy-silacyclopentane. In yet another aspect, the present invention relates to a method of applying an anti-reflective coating to an optical surface of a mold. In one embodiment, the method includes the steps of providing a lens mold having an optical surface; forming a layer of a super hydrophobic material with a thickness of about 30 to 40 nm over the optical surface, wherein the super hydrophobic material contains dipodal silane; forming an anti-reflective coating layered structure over the layer of the super hydrophobic material; and forming a layer of a coupling agent with a monolayer thickness over the anti-reflective coating layered structure by vapor deposition under aprotic conditions or by dip coating using a solution of a silane coupling agent in an aprotic solvent.

In one embodiment, the step of forming an anti-reflective coating layered structure over the layer of super hydrophobic material can be performed with the steps of:

(1) forming a first layer of a first material with a first index of refraction and a thickness of about 5 to 100 nm over the layer of the super hydrophobic material;

(2) forming a second layer of a second material with a second index of refraction and a thickness of about 40 to 50 nm, to the first layer;

(3) forming a third layer of the first material with the first index of refraction and a thickness about 10 to 20 nm, to the second layer;

(4) forming a fourth layer of the second material with the second index of refraction and a thickness of about 50 to 70 nm, to the third layer;

(5) forming a fifth layer of the first material with the first index of refraction and a thickness of about 25 to 40 nm, to the fourth layer;

(6) forming a sixth layer of the second material with the second index of refraction and a thickness of about 10 to 25 nm, to the fifth layer; and (7) forming a seventh layer of the first material with the first index of refraction and a thickness of about 5 to 15 nm, to the sixth layer.

In one embodiment, the first index of refraction L and the second index of refraction H satisfy a ratio of H/L>1. In other words, the value of the second index of refraction is greater than the value of the first index of refraction.

In one embodiment, the first material with the first index of refraction comprises $SiO_2$, and the second material with the second index of refraction comprises $ZrO_2$.

In practicing the present invention according to the methods set forth above, each layer of $SiO_2$ in the anti-reflective coating layered structure is deposited using ion assist or without using ion assist.

It is further noted that these anti-reflecting layers may be deposited by techniques known in the art such as resistance evaporation, electron beam evaporation, sputtering and other known techniques. In some cases it is desirable to ion assist the evaporation techniques by exposing the evaporation stream to a plasma of Argon or Oxygen during the deposition. On the other hand, in some other cases it is desirable not to ion assist the evaporation techniques.

In one embodiment, the dipodal silane can be bis (trimethoxysilylpropyl) amine.

In one embodiment, the layer of coupling agent is formed of a composition that comprises cyclic azasilanes. In one particular embodiment, the layer of coupling agent is formed of N-n-butyl-aza-2,2-dimethoxy-silacyclopentane.

In yet another aspect, the present invention relates to a mold with an optical surface having an anti-reflective coating that is transferable to an optical surface of a lens. In various embodiments, such a mold has a layer of a hydrophobic material deposited over an optical surface of the mold, wherein the hydrophobic material contains an amount of dipodal silane that is a relative percentage of the hydrophobic material; an anti-reflective coating layered structure deposited over the layer of the hydrophobic material; and a layer of a coupling agent that is deposited using vapor deposition and with a monolayer thickness deposited over the anti-reflective coating layered structure. In one embodiment, the hydrophobic layer is a super hydrophobic layer having a thickness of about 30 to 40 nm, and the amount of the dipodal silane is about 1.7-8.3% of said super hydrophobic material by weight.

In one embodiment, the dipodal silane can be bis (trimethoxysilylpropyl) amine.

In a further aspect, the present invention relates to an optical lens. The optical lens has a lens body with an optical surface and an anti-reflective coating formed over the optical surface, where in various embodiments, the anti-reflective coating has a layer of a coupling agent with a monolayer thickness deposited over the optical surface; an anti-reflective coating layered structure deposited over the layer of the coupling agent; and a layer of a hydrophobic material deposited over the anti-reflective coating layered structure. In one embodiment, the hydrophobic layer is a super hydrophobic layer having a thickness of about 30 to 40 nm, and the amount of the dipodal silane is about 1.7-8.3% of said super hydrophobic material by weight.

In one aspect, the present invention relates to a coupling agent usable in lens making In one embodiment, the silane coupling agent comprises cyclic azasilanes. In one specific embodiment, cyclic azasilanes comprise N-n-butyl-aza-2,2-dimethoxy-silacyclopentane.

These and other aspects of the present invention will become apparent from the following description of the preferred embodiment taken in conjunction with the following drawings, although variations and modifications therein may be affected without departing from the spirit and scope of the novel concepts of the disclosure.

DETAILED DESCRIPTION OF THE INVENTION

Figure 1:
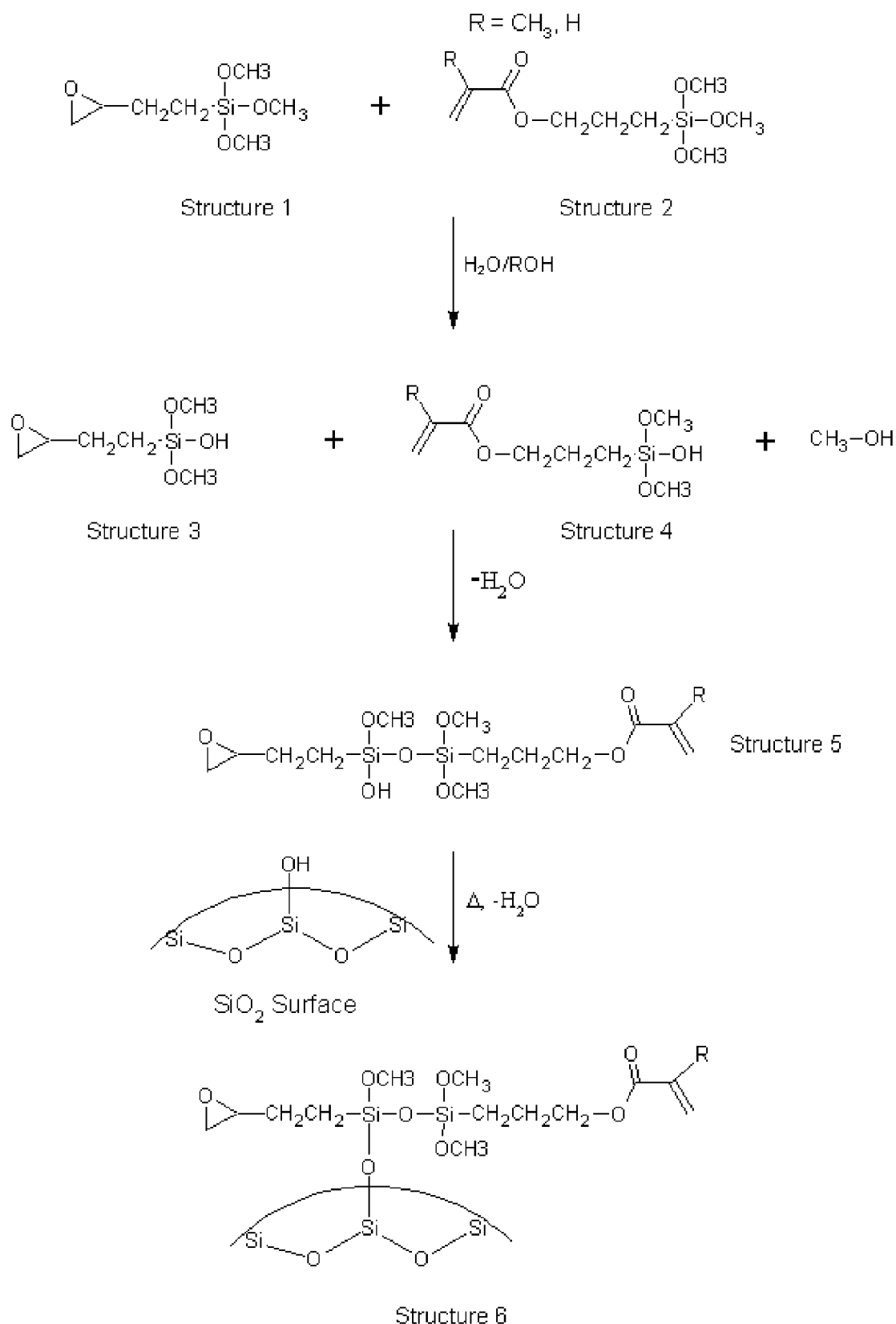
FIG. 1 shows chemical reactions related to coupling agents utilized in related art for manufacturing an anti-reflective coated lens.

The present invention is more particularly described in the following examples, which are intended as illustrative only since numerous modifications and variations therein will be apparent to those skilled in the art. Various embodiments of the invention are now described in detail. Referring to the drawings, like numbers indicate like parts throughout the views. As used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. The use of examples anywhere in this specification, including examples of any terms discussed herein, is illustrative only, and in no way limits the scope and meaning of the invention or of any exemplified term. Likewise, the invention is not limited to various embodiments given in this specification.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

Overview of the Invention

The description will be made as to the embodiments of the present invention in conjunction with the accompanying drawings in FIGS. 1-6. In accordance with the purposes of this invention, as embodied and broadly described herein, this invention relates to AR-coated spectacle lenses, compositions and methods of making AR lenses.

According to various embodiments of the present invention, a layer of $MgF_2$ is applied using ion assist to a clean optical surface of a plastic mold, preferably with a thickness of about 45 nm. A coating layer of a super hydrophobic material is then applied. The super hydrophobic material contains about 1.7-8.3% of dipodal silane by weight relative to the super hydrophobic material. Subsequent to the super hydrophobic coating, an anti-reflective (AR) coating is applied. The AR coating is a layered structure with multiple layers of dielectric materials (4 to 7 layers or even more) that are applied by vacuum deposition such that the first and last layer are ion-assisted $SiO_2$. Preferably, the anti-reflective coating is a layered structure with multiple layers of three or more dielectric materials having alternating high and low refractive indexes.

Dipodal silanes are available from Gelest, Inc. A preferred dipodal silane can be bis(trimethoxysilylpropyl)amine having the formula:

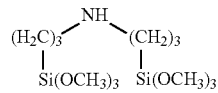

A layer of cyclic azasilane as a silane coupling agent is applied to the AR-coated mold to promote adhesion of the hard coating. The coupling agent layer must be applied under aprotic conditions. This can be done using methods commonly practiced in the lens industry today (such as spin, spray, dip, vacuum coating). The silane from the coupling agent will bond to the anti-reflective coating and the functional group will bond with the organic hard coat, respectively. The coupling agent layer is applied at room temperature.

The next coating layer applied to the mold is the scratch-resistant (hard) coating. The hard coat can be applied by conventional methods used in the lens industry, including spin, spray, or dip coating followed by curing.

The exemplary process illustrated above can be repeatedly applied to different optical surfaces of an optical mold assembly containing a front mold and a back mold. Following the applications of the coating to both of the front and back molds, the molds are assembled with a spacer ring to form the optical mold assembly. The cavity of the assembly is then filled with lens material formulation and cured. After the cure is complete, the lens is removed from the assembly. All coatings except $MgF_2$ are transferred to the lens so that the lens has super hydrophobic, anti-reflective, and scratch resistance coatings applied. This process may also be used to make polarized and photochromic lenses.

Thus, in one aspect, more specifically, the invention relates to a method for making an AR-coated plastic substrate having good adhesion of the AR coating. The plastic substrate in one embodiment is a plastic ophthalmic spectacle lens.

In another aspect, the invention relates to a method of making AR coated plastic ophthalmic spectacle lenses on-site.

An AR coating is commonly applied to the surface of lenses to reduce reflection. Often, the AR coating is made of multiple layers of high index and low index materials such as $ZrO_2$ and $SiO_2$. One problem with inorganic silica AR coatings is that they do not readily adhere to plastic organic lenses. The present invention successfully solves the problem by, among other things, using a coupling layer between the inorganic silica AR coating and the lens. In one embodiment of the present invention, the coupling layer is formed by utilizing cyclic azasilane.

In general, the method for forming an ophthalmic lens having an AR coating thereon is comprised of the steps of preparing first and second molds having optical surfaces facing each other. In a preferred embodiment, molds and a gasket such as described in U.S. Pat. No. 7,114,696 are used. Various desired coatings are applied to the interior of one or both molds. The molds with the coatings thereon are placed in a gasket assembly which provides a space between the molds. A liquid monomer is placed in the space and is cured to provide a lens.

The molds can be formed of any suitable material which is capable of withstanding the processing temperatures hereinafter utilized and which can provide surfaces of the type required for the optical elements being prepared.

In one embodiment of the present invention, as a first step, a coating is applied by electron beam deposition directly onto the plastic mold optical surface. Subsequent to the first coating, a second coating may be applied before a multilayer AR coating is applied in reverse order. In one embodiment of the present invention, an AR coating is a multilayer structure with alternating layers formed with two different materials, a high index material and a low index material. In one preferred embodiment of the present invention, an AR coating is a multilayer structure with 7 alternating layers formed with two different materials, a high index material H and a low index material L with a ratio H/L>1. Materials found to be suitable for practicing the present invention are zirconium dioxide (referred as "$ZrO_2$") as a high index material and silicon dioxide as a low index material, having an index of refraction of approximately 1.46.

In one embodiment of the present invention, the layers are applied by vacuum deposition such that the first and last layers are silicon dioxide ($SiO_2$). It is preferred that the AR chamber be humidified during application of the last layer of silicon oxide.

Following the AR coating application, a layer or film of the coupling agent cyclic azasilane is applied by vapor phase deposition. The cyclic azasilane will bond to surface hydroxyls on the silicon dioxide layer, opening the ring and resulting in an organic molecule on the surface. This can be done under vacuum, at room temperature, and does not require water as a catalyst.

Next, a scratch resistant (hard) coating is applied. The hard coat can be applied as either an extension of the AR coating process by vacuum deposition or by the more conventional methods of spin, spray, or dip coating, with the coating application followed by curing.

Following the application of the various coatings to the mold, a front and back mold are assembled. The cavity of the assembly is then filled with lens material formulation which is then cured and bonds to the hard coat. After the cure is complete, the lens is removed from the assembly. All coatings are transferred to the lens so that the lens has hydrophobic, anti-reflective, and scratch resistance coatings applied.

Cyclic azasilanes are available from Gelest, Inc. Generic formulas include azasilacyclopentanes having the formula:

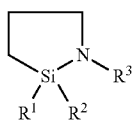

where $R^1$ and $R^2$ are independently selected from the group consisting of branched and linear, substituted and unsubstituted alkyl, alkenyl and alkoxy groups, and where $R^3$ is selected from the group consisting of substituted and unsubstituted, saturated and unsaturated, branched and linear aliphatic hydrocarbon groups; substituted and unsubstituted, branched and linear aralkyl groups; substituted and unsubstituted aryl groups; and hydrogen. Cyclic azasilanes also include diazasilacyclic compounds having the formula:

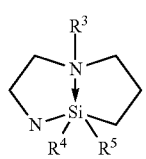

where $R^3$ is selected from the group consisting of substituted and unsubstituted, saturated and unsaturated, branched and linear aliphatic hydrocarbon groups; substituted and unsubstituted, branched and linear aralkyl groups; substituted and unsubstituted aryl groups; and hydrogen; and wherein $R_4$ and $R_5$ are independently selected from the group consisting of substituted and unsubstituted, branched and linear alkyl and alkoxy groups.

A preferred super hydrophobic compound is Optool DSX available from Daikin. This hydrophobic compound does not contain additives that are typically included in commercial super hydrophobic preparations to increase sticking of the super hydrophobic material to a plastic lens.

These and other aspects of the present invention are more specifically described below.

Implementations and Examples of the Invention

Without intent to limit the scope of the invention, additional exemplary embodiments and their related results according to the embodiments of the present invention are given below. Note that titles or subtitles may be used in the examples for convenience of a reader, which in no way should limit the scope of the invention.

Moreover, certain theories are proposed and disclosed herein; however, in no way should they, whether they are right or wrong, limit the scope of the invention so long as the invention is practiced according to the invention without regard for any particular theory or scheme of action.

EXAMPLE 1

Cyclic Azasilanes

Various types of cyclic azasilanes can be used to practice the present invention, including:

(a) SIB1932.4 or N-n-BUTYL-AZA-2,2-DIMETHOXYSILACYCLOPENTANE, C9H21NO2Si, with the following formula:

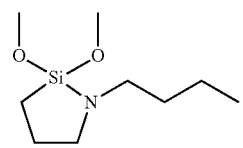

(b) SID3543.0 or 2,2-DIMETHOXY-1,6-DIAZA-2-SILACYCLOOCTANE, C7H18N2O2Si, with the following formula:

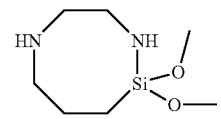

(c) SIA0592.0 or N-AMINOETHYL-AZA-2,2,4-TRIMETHYLSILACYCLOPENTANE, C8H21NSi, with the following formula:

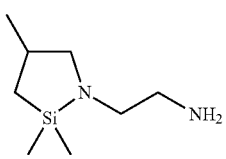

(d) SIA0380.0 or N-ALLYL-AZA-2,2-DIMETHOXYSI-LACYCLOPENTANE C8H17NO2Si, with the following formula:

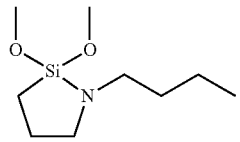

EXAMPLE 2

Coating Bonding Tests

This example shows various tests utilized for the bonding of coatings produced according to various embodiments of the present invention.

Cross-Hatch Test. In the cross-hatch test, a series of 10 lines spaced 1 mm apart is cut into the coating with a razor blade. A second series of 10 lines spaced 1 mm apart at right angles to and overlaying the first is cut into the coating. A piece of cellophane tape is then applied over the crosshatch pattern and pulled quickly away from the coating.

Crazing Test. In the crazing test, a lens is de-molded then annealed at 80° C. for 20 minutes. The lens is quickly transferred to room temperature water and it is checked for crazing. If no crazing is apparent, then the AR/coupling agent system is acceptable.

Boiling Salt Water Test. In the boiling salt water test, the lens is first immersed for two minutes in a boiling salt solution containing 4.5% NaCl and 0.8% $NaH_2PO_4.2H_2O$. Next, the lens is quickly transferred to room temperature (18-24° C.) deionized water. If no crazing or delamination in the coating is noted, then the AR/coupling agent system is acceptable.

EXAMPLE 3

Preparation of an AR Coating that is Applied to a Disposable Mold

In this Example, among other things, a process of preparation of applying an AR coating to a disposable mold is provided according to one embodiment of the present invention. It is noted that in this Example, $SiO_2$ layers are formed or deposited with or without ion assist.

Figure 3:
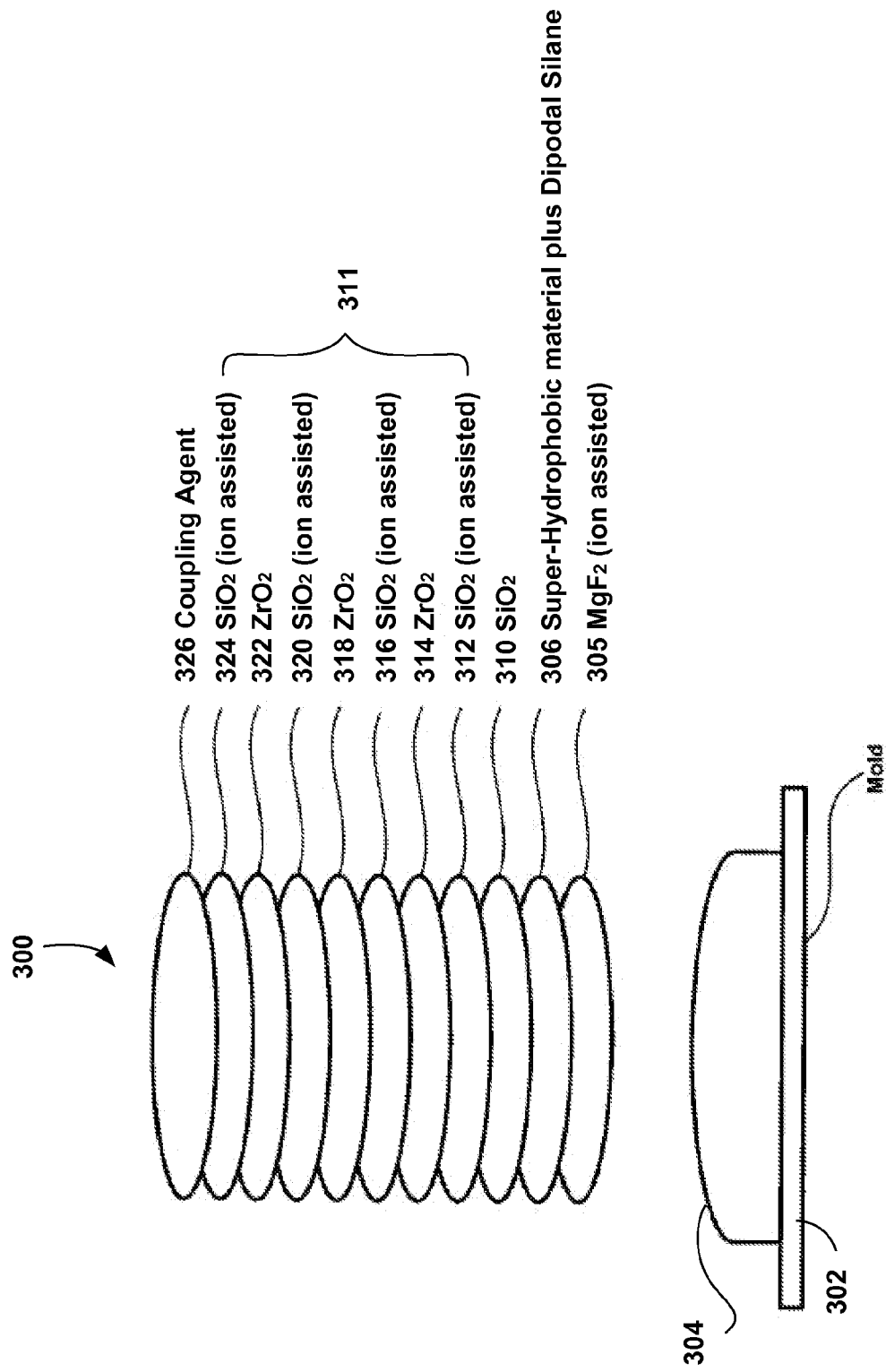
FIG. 3 shows preparation of an anti-reflective coated lens mold according to one embodiment of the present invention.

Referring now to FIG. 3, the processes described below are performed with a standard box coater and an electron beam for evaporation in connection with a mold 302 having an optical surface 304. The processes are done by using well known vacuum practices.

Procedure:

(1) Cleaning the optical surface 304 of the mold 302. In one embodiment of the present invention, a plasma cleaning is performed on the mold surface for about 2 min.

(2) Forming a layer 305 of $MgF_2$ with a thickness of about 45 nm to the optical surface 304.

(3) Forming a layer 306 of a super hydrophobic material with a thickness of about 30 to 40 nm over the layer 305, where the super hydrophobic material contains about 1.7-8.3% of dipodal silane by weight relative to the super hydrophobic material.

(4) Forming a layer 310 of $SiO_2$ that is deposited without using ion assist and with a thickness of about 5 to 40 nm to the layer 306.

(5) Forming a layer 312 of $SiO_2$ that is deposited using ion assist and with a thickness of about 5 to 100 nm to the layer 310.

(6) Forming a layer 314 of $ZrO_2$ with a thickness of about 40 to 50 nm to the layer 312.

(7) Forming a layer 316 of $SiO_2$ that is deposited using ion assist and with a thickness about 10 to 20 nm to the layer 314.

(8) Forming a layer 318 of $ZrO_2$ with a thickness of about 50 to 70 nm to the layer 316.

(9) Forming a layer 320 of $SiO_2$ that is deposited using ion assist and with a thickness of about 25 to 40 nm to the layer 318.

(10) Forming a layer 322 of $ZrO_2$ with a thickness of about 10 to 25 nm to the layer 320.

(11) Forming a layer 324 of $SiO_2$ that is deposited using ion assist and with a thickness of about 5 to 15 nm to the layer 322.

(12) Forming a layer 326 of a coupling agent that is deposited using dip coating or vapor deposition and with a monolayer of thickness to the layer 324.

It is noted that in this embodiment, the layer 306 of the super hydrophobic material contains about 1.7-8.3% of dipodal silane by weight relative to the super hydrophobic material so that the AR coating can be stable. An example of the concentration of dipodal silane in the super hydrophobic is that every 0.6 g of super hydrophobic material contains about 0.01 g to 0.05 g of dipodal silane. If no or too little dipodal silane is used in the super hydrophobic material, the AR coating crazes and separates from the mold. Moreover, layer 310 of $SiO_2$ functions as a protective seal to the AR layered structure 311 and also as natural bonding surface or a "link" between the AR layered structure 311 and the layer 306 of a super hydrophobic material. Likewise, layer 324 of $SiO_2$ provides a natural bonding surface or "link" between the AR layered structure 311 and the layer 326 of coupling agent. It is noted that although layer 310 and layer 312 both are formed of $SiO_2$, they are formed with different processes such that they adhere to each other but function differently.

EXAMPLE 4

Preparation of an AR Coating that is Applied to a Disposable Mold

In this Example, among other things, a process of preparation of applying an AR coating to a disposable mold is provided according to another embodiment of the present invention. It is noted that in this Example, $SiO_2$ layers are formed or deposited with ion assist.

Figure 4:
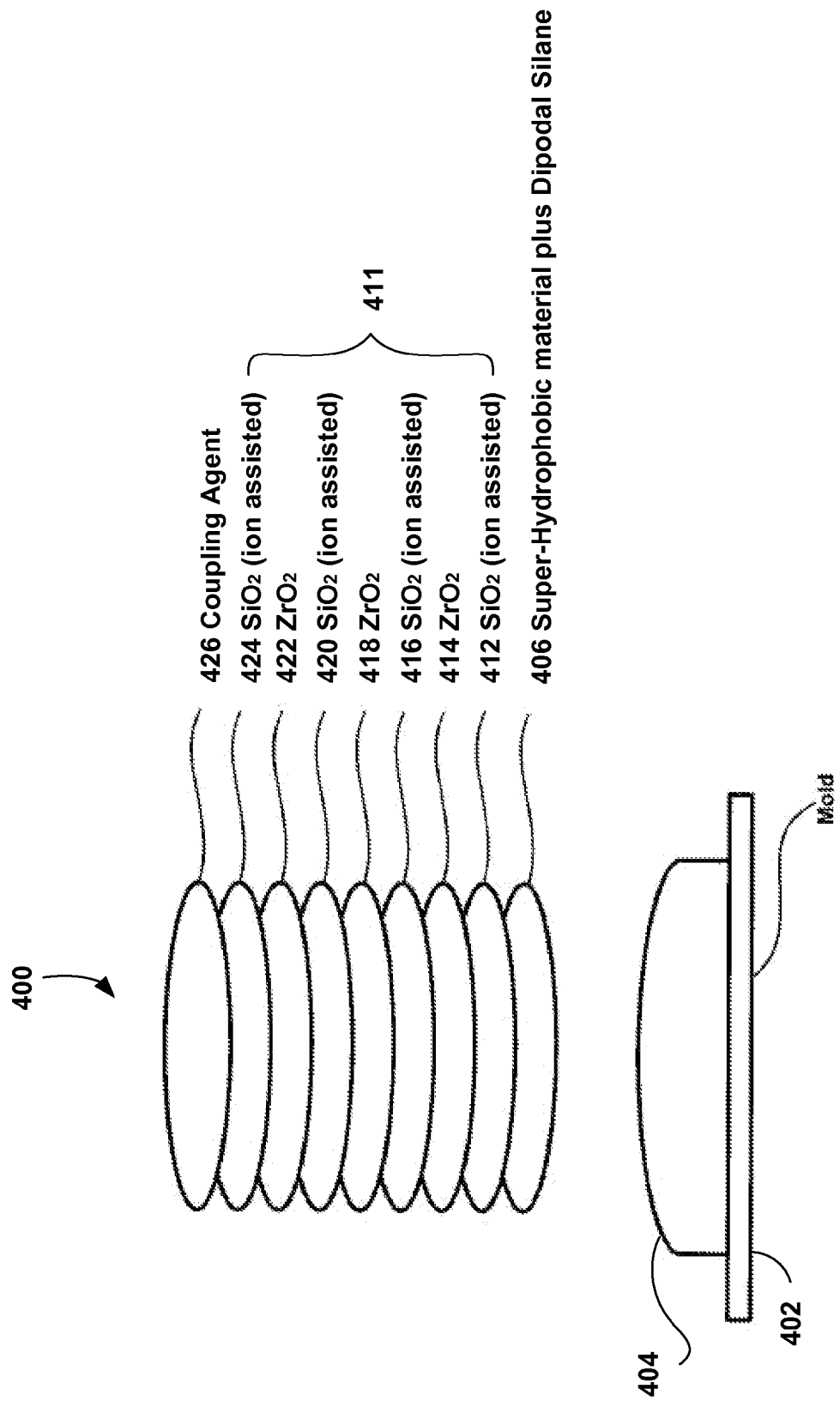
FIG. 4 shows preparation of an anti-reflective coated lens mold according to one embodiment of the present invention.

Referring now to FIG. 4, the processes described below are performed with a standard box coater and an electron beam for evaporation in connection with a mold 402 having an optical surface 404. The processes are done using well known vacuum practices.

Procedure:

(1) Cleaning the optical surface 404 of the mold 402. In one embodiment of the present invention, a plasma cleaning is performed on the mold surface for about 2 min.

(2) Forming a layer 406 of a super hydrophobic material with a thickness of about 30 to 40 nm over the optical surface 404, where the super hydrophobic material contains about 1.7-8.3% of dipodal silane by weight relative to the super hydrophobic material.

(3) Forming a layer 412 of $SiO_2$ that is deposited using ion assist and with a thickness of about 60 to 120 nm to the layer 406.

(4) Forming a layer 414 of $ZrO_2$ with a thickness of about 40 to 50 nm to the layer 412.

(5) Forming a layer 416 of $SiO_2$ that is deposited using ion assist and with a thickness about 10 to 20 nm to the layer 414.

(6) Forming a layer 418 of $ZrO_2$ with a thickness of about 50 to 70 nm to the layer 416.

(7) Forming a layer 420 of $SiO_2$ that is deposited using ion assist and with a thickness of about 25 to 40 nm to the layer 418.

(8) Forming a layer 422 of $ZrO_2$ with a thickness of about 10 to 25 nm to the layer 420.

(9) Forming a layer 424 of $SiO_2$ that is deposited using ion assist and with a thickness of about 5 to 15 nm to the layer 422.

(10) Forming a layer 426 of a coupling agent that is deposited using dip coating or vapor deposition and with a monolayer thickness to the layer 424.

EXAMPLE 5

Preparation of an AR Coating that is Applied to a Disposable Mold

In this Example, among other things, a process of preparation of applying an AR coating to a disposable mold is provided according to yet another embodiment of the present invention. It is noted that in this Example, $SiO_2$ layers are formed or deposited with or without ion assist.

Figure 5:
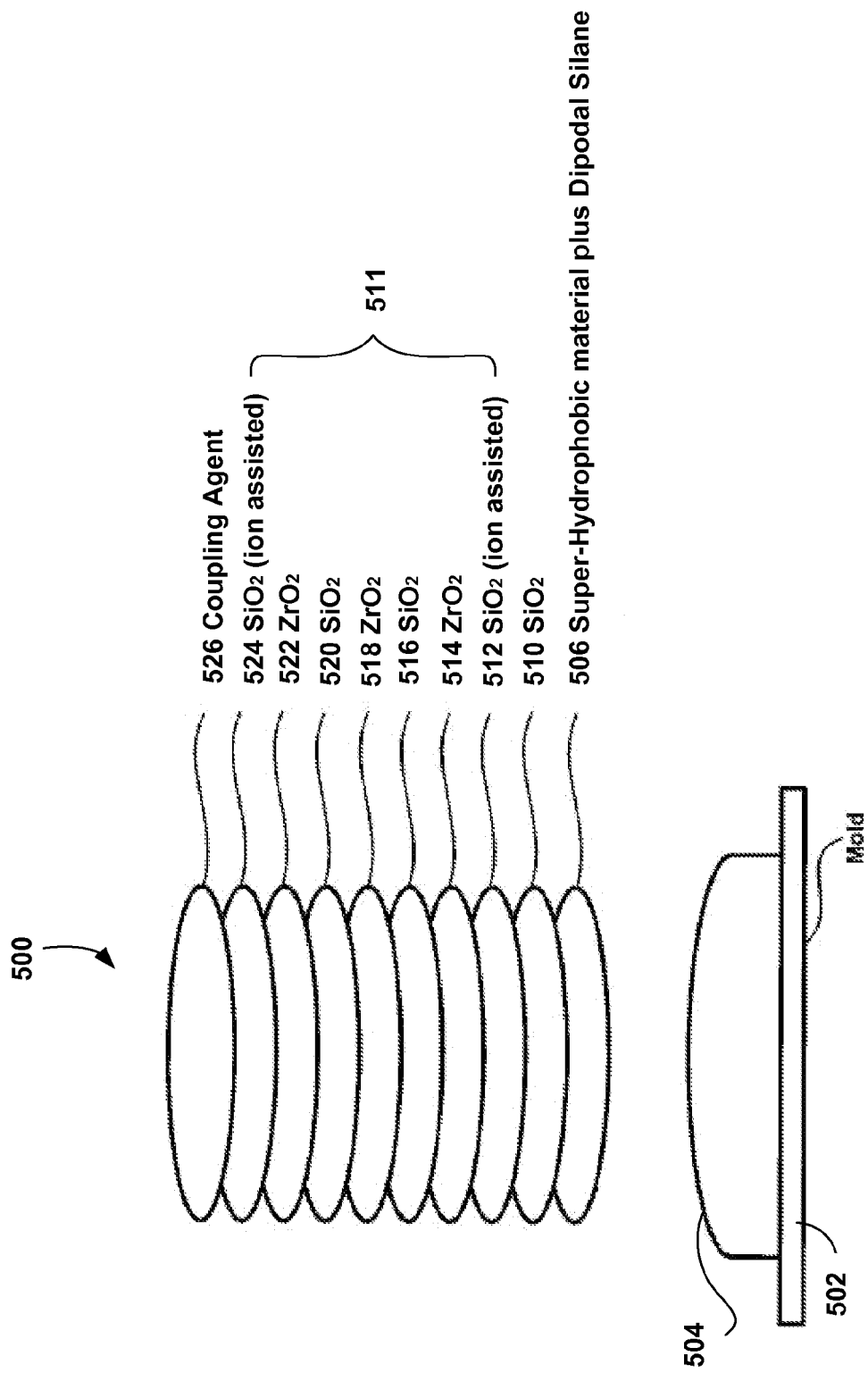
FIG. 5 shows preparation of an anti-reflective coated lens mold according to one embodiment of the present invention.

Referring now to FIG. 5, the processes described below are performed with a standard box coater and an electron beam for evaporation in connection with a mold 502 having an optical surface 504. The processes are done using well known vacuum practices.

Procedure:

(1) Cleaning the optical surface 504 of the mold 502. In one embodiment of the present invention, plasma cleaning is performed on the mold surface for about 2 min.

(2) Forming a layer 506 of a super hydrophobic material with a thickness of about 30 to 40 nm over the optical surface 504, where the super hydrophobic material contains about 1.7-8.3% of dipodal silane by weight.

(3) Forming a layer 510 of $SiO_2$ that is deposited without using ion assist and with a thickness of about 5 to 40 nm to the layer 506.

(4) Forming a layer 512 of $SiO_2$ that is deposited using ion assist and with a thickness of about 5 to 100 nm to the layer 510.

(5) Forming a layer 514 of $ZrO_2$ with a thickness of about 40 to 50 nm to the layer 512.

(6) Forming a layer 516 of $SiO_2$ that is deposited without using ion assist and with a thickness about 10 to 20 nm to the layer 514.

(7) Forming a layer 518 of $ZrO_2$ with a thickness of about 50 to 70 nm to the layer 516.

(8) Forming a layer 520 of $SiO_2$ that is deposited without using ion assist and with a thickness of about 25 to 40 nm to the layer 518.

(9) Forming a layer 522 of $ZrO_2$ with a thickness of about 10 to 25 nm to the layer 520.

(10) Forming a layer 524 of $SiO_2$ that is deposited using ion assist and with a thickness of about 5 to 15 nm to the layer 522.

(11) Forming a layer 526 of a coupling agent that is deposited using dip coating or vapor deposition and with a monolayer thickness to the layer 524.

EXAMPLE 6

Preparation of an AR Coating that is Applied to a Disposable Mold

In this Example, among other things, a process of preparation of applying an AR coating to a disposable mold is provided according to a further embodiment of the present invention. It is noted that in this Example, $SiO_2$ layers are formed or deposited with or without ion assist.

Figure 6:
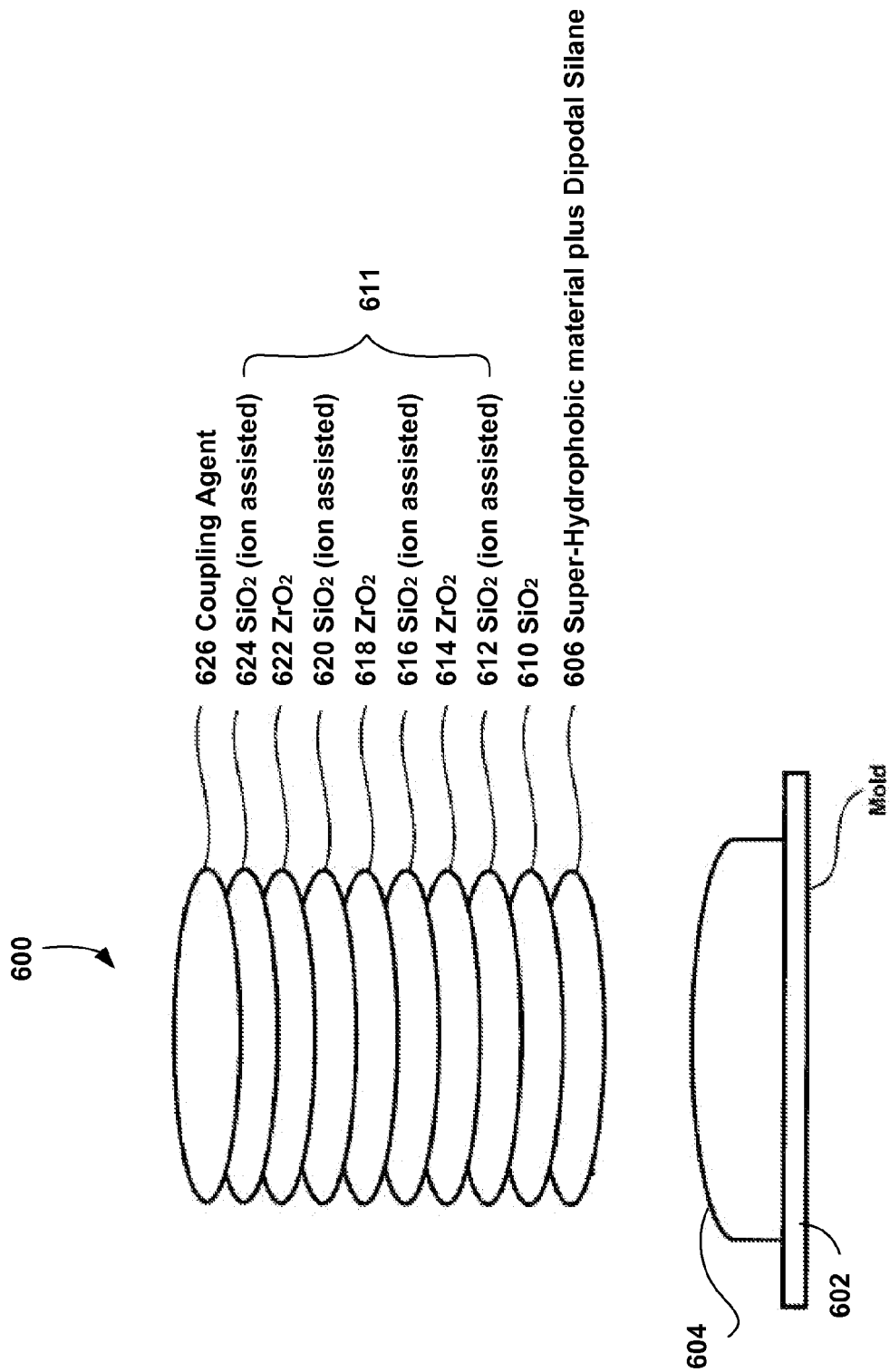
FIG. 6 shows preparation of an anti-reflective coated lens mold according to one embodiment of the present invention.

Referring now to FIG. 6, the processes described below are performed with a standard box coater and an electron beam for evaporation in connection with a mold 602 having an optical surface 604. The processes are done using well known vacuum practices.

Procedure:

(1) Cleaning the optical surface 604 of the mold 602. In one embodiment of the present invention, plasma cleaning is performed on the mold surface for about 2 min.

(2) Forming a layer 606 of a super hydrophobic material with a thickness of about 30 to 40 nm over the optical surface 604, where the super hydrophobic material contains about 1.7-8.3% of dipodal silane by weight relative to the super hydrophobic material.

(3) Forming a layer 610 of $SiO_2$ that is deposited without using ion assist and with a thickness of about 5 to 40 nm to the layer 606.

(4) Forming a layer 612 of $SiO_2$ that is deposited using ion assist and with a thickness of about 5 to 100 nm to the layer 610.

(5) Forming a layer 614 of $ZrO_2$ with a thickness of about 40 to 50 nm to the layer 612.

(6) Forming a layer 616 of $SiO_2$ that is deposited using ion assist and with a thickness about 10 to 20 nm to the layer 614.

(7) Forming a layer 618 of $ZrO_2$ with a thickness of about 50 to 70 nm to the layer 616.

(8) Forming a layer 620 of $SiO_2$ that is deposited using ion assist and with a thickness of about 25 to 40 nm to the layer 618.

(9) Forming a layer 622 of $ZrO_2$ with a thickness of about 10 to 25 nm to the layer 620.

(10) Forming a layer 624 of $SiO_2$ that is deposited using ion assist and with a thickness of about 5 to 15 nm to the layer 622.

(11) Forming a layer 626 of a coupling agent that is deposited using vapor deposition and with a monolayer thickness to the layer 624.

EXAMPLE 7

Preparation and Application of Coupling Agent

In Examples 3-6, among other things, the present invention is practiced with a layer of a coupling agent that is applied to the AR-coated mold to promote adhesion of the hard coating.

Figure 2:
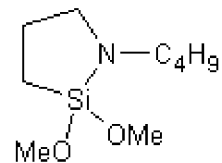
FIG. 2 shows chemical reactions related to coupling agents utilized for manufacturing an anti-reflective coated lens according to one embodiment of the present invention.
Figure 2:
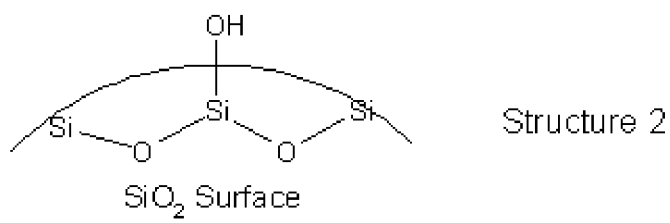
Figure 2:
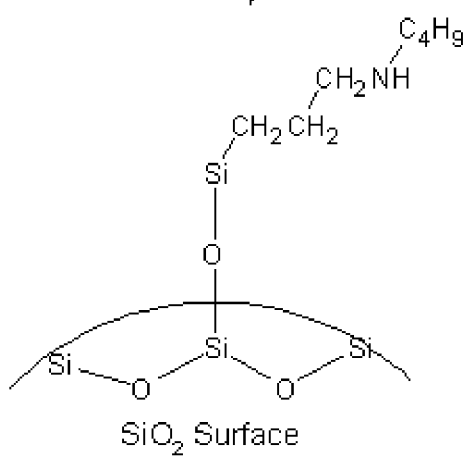

Material-wise, the coupling agents are functional silanes in which the silane bonds to the anti-reflective coating and the functional group bonds with the organic hard coat. According to one embodiment of the present invention, cyclic azasilanes are particularly well suited for the application, as they will form silane bonds at room temperature via a ring-opening reaction. This results in a monolayer with functional groups that readily attach to the hard coat, forming a strong AR to hard-coat bond. It is believed that it is the first time in the industry and only by the inventive discovery of the present invention, that cyclic azasilanes are utilized in an optical lens forming process as coupling agents. For embodiments as shown in FIGS. 3-6, where $SiO_2$ is used as the first material with first index of refraction, utilizing N-n-butyl-aza-2,2-dimethoxy-silacyclopentane as a silane coupling agent allows a surface bonding ring opening reaction without requiring water or heat, as shown in FIG. 2, resulting in much better bonding and making on-site AR lens formation a reality.

Procedure-wise, the coupling agent must be applied under aprotic conditions and can be done using many of the methods commonly practiced in the lens industry today, such as spin, spray, dip, and vacuum coating. Two specific examples of coupling agent application are provided below.

A. Vacuum Coating—Procedure:
  (1) A pair of optical molds comprising a front mold and a back mold, where corresponding optical surfaces of the molds are AR-coated molds according to one of various embodiments of the present invention as illustrated in Examples 3-6, is placed in a vacuum chamber, which is evacuated to create an aprotic environment with a predetermined pressure, in which a coupling agent will vaporize when introduced into the chamber.
  (2) The coupling agent is introduced into the sealed chamber and allowed to coat and react with each AR coating for a minimum of 10 minutes.
  (3) The chamber is evacuated to the original (pre-coupling agent), predetermined pressure to remove excess coupling agent.
  (4) The vacuum is released and the optical mold assembly is removed from the chamber. Afterwards, a hard coat can be applied.

B. Dip Coating—Procedure:
  (1) A solution of coupling agent in an aprotic solvent is prepared (0.05% minimum). Examples of aprotic solvents include toluene, benzene, petroleum ether, or other hydrocarbon solvents.
  (2) An AR-coated mold, prepared according to one of various embodiments of the present invention as illustrated in Examples 3-6, is exposed to (or treated with) the solution for a minimum of 5 minutes at room temperature.
  (3) The treated mold is removed from the solution and rinsed with ethanol or a similar solvent.
  (4) The mold is then air-dried and afterwards a hard coat can be applied.

EXAMPLE 8

Procedure for Making an AR-Coated Lens

This example shows a method or procedure for making an AR-coated lens according to one embodiment of the present invention.

The corresponding optical surfaces of a front mold and a back mold of an optical mold assembly were AR-coated according to the one embodiment of the present invention illustrated in Example 3. A layer (326) of a coupling agent consisting of or having N-n-butyl-aza-2,2-dimethoxy-silacyclopentane was then formed onto the AR surfaces (324) using a dip coating method as set forth above in Example 7. A solution was prepared of 0.2% coupling agent in petroleum ether. The optical surfaces were submerged in the solution for 5 minutes at room temperature. They were then rinsed with ethanol, blown dry with an air gun, and hard-coated within one hour using a spin-coating process. Upon lens monomer casting and curing, the AR and super hydrophobic coatings transferred from the mold onto the lens.

EXAMPLE 9

Procedure for Making an AR-Coated Lens

This example shows a method or procedure of making an AR-coated lens according to one embodiment of the present invention.

The corresponding optical surfaces of a front mold and a back mold of an optical mold assembly were AR-coated according to the one embodiment of the present invention illustrated in one of Examples 4-6. A layer (426, 526, 626) of a coupling agent consisting of or having N-n-butyl-aza-2,2-dimethoxy-silacyclopentane was then formed onto the AR surfaces (424, 524, 624) using a dip coating method as set forth above in Example 7. A solution was prepared of 0.05% coupling agent in petroleum ether. The optical surfaces were submerged in the solution for 5 minutes at room temperature. They were then rinsed with ethanol, allowed to air-dry, and immediately hard-coated using a spin-coating process. Upon casting, the AR and super hydrophobic coatings transferred from the mold onto the lens.

EXAMPLE 10

Procedure for Making an AR-Coated Lens

This example shows a method or procedure of making an AR-coated lens according to one embodiment of the present invention.

The corresponding optical surfaces of a front mold and a back mold of an optical mold assembly were AR-coated according to the one embodiment of the present invention illustrated in Example 3. The molds with AR-coated optical surfaces were then placed on the floor of a vacuum chamber under a predetermined pressure of about −28.6 in. Hg. About 0.2 mL of the N-n-butyl-aza-2,2-dimethoxy-silacyclopentane was injected into the chamber and vaporized under the predetermined pressure. The N-n-butyl-aza-2,2-dimethoxy-silacyclopentane was given 10 minutes to react with the AR-coated surfaces to form a layer of a coupling agent, after which the vacuum pump was turned on for 5 minutes in order to remove any excess coupling agent. Molds were then immediately hard-coated and cast into lenses. The AR and super hydrophobic coatings transferred from the mold onto the lens.

EXAMPLE 11

Procedure for Making an AR-Coated Lens

This example shows a method or procedure for making an AR-coated lens according to one embodiment of the present invention.

The corresponding optical surfaces of a front mold and a back mold of an optical mold assembly were AR-coated according to the one embodiment of the present invention illustrated in Example 3. The molds with AR-coated optical surfaces were then placed on the floor of a vacuum chamber under a predetermined pressure of about −28.6 in. Hg. 0.05 mL of the N-n-butyl-aza-2,2-dimethoxy-silacyclopentane coupling agent was injected into the chamber and vaporized under the predetermined pressure. The coupling agent was given 10 minutes to react with the AR coated optical surfaces, after which the vacuum pump was turned on for 5 minutes in order to remove any excess coupling agent. Molds were then immediately hard-coated and assembled and lens monomer was cast and cured into lenses. The AR and super hydrophobic coatings transferred from the mold onto the lens.

EXAMPLE 12

Procedure for Making an AR-Coated Lens

This example shows a method or procedure for making an AR-coated lens according to one embodiment of the present invention.

The corresponding optical surfaces of a front mold and a back mold of an optical mold assembly were AR-coated according to the one embodiment of the present invention illustrated in Example 3. The molds with AR-coated optical surfaces were then placed on the floor of a vacuum chamber under a predetermined pressure of about −28.6 in. Hg. A solution was prepared with 10% of N-n-butyl-aza-2,2-dimethoxy-silacyclopentane coupling agent in hexane. 0.1 mL of the solution (0.01 mL of the coupling agent) was injected into the chamber and vaporized under the predetermined pressure. The coupling agent was given 10 minutes to react with the AR surfaces, after which the vacuum pump was turned on for 5 minutes in order to remove any excess coupling agent. Molds were then immediately hard-coated and cast into lenses. The AR and super hydrophobic coatings transferred from the mold onto the lens.

Thus, in another aspect, the present invention relates to a method of applying an anti-reflective coating to an optical surface of a mold. In one embodiment, referring to FIG. 3, the method includes the steps of:

providing a lens mold 302 having an optical surface 304;

forming a layer 305 of $MgF_2$ that is ion assisted with a thickness of about 45 nm to the optical surface 304;

forming a layer 306 of a super hydrophobic material with a thickness of about 30 to 40 nm over the layer 305, where the super hydrophobic material contains about 1.7-8.3% of dipodal silane by weight relative to the super hydrophobic material;

forming a layer 310 of $SiO_2$ that is deposited without using ion assist and with a thickness of about 5 to 40 nm to the layer 306;

forming an anti-reflective coating layered structure 311 to the layer 310; and forming a layer 326 of a coupling agent that is deposited using vapor deposition and with a monolayer thickness to the layer 324.

In the embodiment shown in FIG. 3, the anti-reflective coating layered structure 311 to the layer 310 can be formed by the steps of:

(1) forming a layer 312 of $SiO_2$ that is deposited using ion assist and with a thickness of about 5 to 100 nm to the layer 310;

(2) forming a layer 314 of $ZrO_2$ with a thickness of about 40 to 50 nm to the layer 312;

(3) forming a layer 316 of $SiO_2$ that is deposited using ion assist and with a thickness about 10 to 20 nm to the layer 314;

(4) forming a layer 318 of $ZrO_2$ with a thickness of about 50 to 70 nm to the layer 316;

(5) forming a layer 320 of $SiO_2$ that is deposited using ion assist and with a thickness of about 25 to 40 nm to the layer 318;

(6) forming a layer 322 of $ZrO_2$ with a thickness of about 10 to 25 nm to the layer 320; and (7) forming a layer 324 of $SiO_2$ that is deposited using ion assist and with a thickness of about 5 to 15 nm to the layer 322.

In one embodiment, the dipodal silane can be bis(trimethoxysilylpropyl)amine.

In one embodiment, the layer of coupling agent is formed of a composition that comprises cyclic azasilanes.

More specifically, in one embodiment, the layer of coupling agent is formed of N-n-butyl-aza-2,2-dimethoxy-silacyclopentane.

Furthermore, in a more general embodiment, the anti-reflective coating layered structure 311 to the layer 310 can be formed by the steps of:

(1) forming a layer 312 of a first material with a first index of refraction, which is deposited using ion assist and with a thickness of about 5 to 100 nm, to the layer 310;

(2) forming a layer 314 of a second material with a second index of refraction, with a thickness of about 40 to 50 nm, to the layer 312;

(3) forming a layer 316 of the first material with the first index of refraction, which is deposited using ion assist and with a thickness about 10 to 20 nm, to the layer 314;

(4) forming a layer 318 of the second material with the second index of refraction, with a thickness of about 50 to 70 nm, to the layer 316;

(5) forming a layer 320 of the first material with the first index of refraction, which is deposited using ion assist and with a thickness of about 25 to 40 nm, to the layer 318;

(6) forming a layer 322 of the second material with the second index of refraction, with a thickness of about 10 to 25 nm, to the layer 320; and (7) forming a layer 324 of the first material with the first index of refraction, which is deposited using ion assist and with a thickness of about 5 to 15 nm, to the layer 322.

In one embodiment, the first index of refraction L and the second index of refraction H satisfy a ratio of H/L>1. In other words, the value of the second index of refraction is greater than the value of the first index of refraction.

In one embodiment as shown in FIG. 3, the first material with the first index of refraction comprises $SiO_2$, and the second material with the second index of refraction comprises $ZrO_2$.

In another aspect, the present invention relates to a mold with an optical surface having an anti-reflective coating that is transferable to an optical surface of a lens. In one embodiment as shown in FIG. 3, such a mold has:

a layer 305 of $SiO_2$ that is ion assisted with a thickness of 5 to 100 nm deposited to an optical surface 304 of the mold 302;

a layer 306 of a super hydrophobic material with a thickness of about 30 to 40 nm over the layer 305, where the super hydrophobic material contains about 1.7-8.3% of dipodal silane by weight relative to the super hydrophobic material;

a layer 310 of $SiO_2$ that is deposited without using ion assist and with a thickness of about 5 to 40 nm deposited to the layer 306;

an anti-reflective coating layered structure 311 deposited to the layer 310; and a layer 326 of a coupling agent that is deposited using vapor deposition and with a monolayer thickness deposited to the layer 324.

In one embodiment, the anti-reflective coating layered structure 311 has:

(1) a layer 312 of $SiO_2$ that is deposited using ion assist and with a thickness of about 5 to 100 nm deposited to the layer 310;

(2) a layer 314 of ZrO$_2$ with a thickness of about 40 to 50 nm deposited to the layer 312;

(3) a layer 316 of SiO$_2$ that is deposited using ion assist and with a thickness about 10 to 20 nm deposited to the layer 314;

(4) a layer 318 of ZrO$_2$ with a thickness of about 50 to 70 nm deposited to the layer 316;

(5) a layer 320 of SiO$_2$ that is deposited using ion assist and with a thickness of about 25 to 40 nm deposited to the layer 318;

(6) a layer 322 of ZrO$_2$ with a thickness of about 10 to 25 nm deposited to the layer 320; and (7) a layer 324 of SiO$_2$ that is deposited using ion assist and with a thickness of about 5 to 15 nm deposited to the layer 322.

In one embodiment, the dipodal silane can be bis(trimethoxysilylpropyl)amine.

In one embodiment, the layer of coupling agent is formed of a composition that comprises cyclic azasilanes. In one particular embodiment, the layer of coupling agent is formed of N-n-butyl-aza-2,2-dimethoxy-silacyclopentane.

In one embodiment, the anti-reflective coating layered structure 311 is formed with:

(1) a layer 312 of a first material with a first index of refraction, which is deposited using ion assist and with a thickness of about 5 to 100 nm, deposited to the layer 310;

(2) a layer 314 of a second material with a second index of refraction, with a thickness of about 40 to 50 nm, deposited to the layer 312;

(3) a layer 316 of the first material with the first index of refraction, which is deposited using ion assist and with a thickness about 10 to 20 nm, deposited to the layer 314;

(4) a layer 318 of the second material with the second index of refraction, with a thickness of about 50 to 70 nm, deposited to the layer 316;

(5) a layer 320 of the first material with the first index of refraction, which is deposited using ion assist and with a thickness of about 25 to 40 nm, deposited to the layer 318;

(6) a layer 322 of the second material with the second index of refraction, with a thickness of about 10 to 25 nm, deposited to the layer 320; and (7) a layer 324 of the first material with the first index of refraction, which is deposited using ion assist and with a thickness of about 5 to 15 nm, deposited to the layer 322.

In one embodiment, the first index of refraction L and the second index of refraction H satisfy a ratio of H/L>1. In other words, the value of the second index of refraction is greater than the value of the first index of refraction.

In one embodiment, the first material with first index of refraction comprises SiO$_2$, and the second material with second index of refraction comprises ZrO$_2$.

In yet another aspect, the present invention relates to an optical lens. In one embodiment, the optical lens has a lens body with an optical surface, and an anti-reflective coating formed on, or more specifically, transferred from a mold such as one set forth above to the optical surface, where the anti-reflective coating is formed with:

a layer 306 of a super hydrophobic material with a thickness of about 30 to 40 nm over the layer 305, where the super hydrophobic material contains about 1.7-8.3% of dipodal silane by weight relative to the super hydrophobic material;

a layer 310 of SiO$_2$ that is deposited without using ion assist and with a thickness of about 5 to 40 nm deposited to the layer 306;

an anti-reflective coating layered structure 311 deposited to the layer 310; and a layer 326 of a coupling agent that is deposited using vapor deposition and with a monolayer thickness deposited to the layer 324 and coupled to the optical surface.

In one embodiment as shown in FIG. 3, the anti-reflective coating layered structure 311 has:

(1) a layer 312 of SiO$_2$ that is deposited using ion assist and with a thickness of about 5 to 100 nm deposited to the layer 310;

(2) a layer 314 of ZrO$_2$ with a thickness of about 40 to 50 nm deposited to the layer 312;

(3) a layer 316 of SiO$_2$ that is deposited using ion assist and with a thickness about 10 to 20 nm deposited to the layer 314;

(4) a layer 318 of ZrO$_2$ with a thickness of about 50 to 70 nm deposited to the layer 316;

(5) a layer 320 of SiO$_2$ that is deposited using ion assist and with a thickness of about 25 to 40 nm deposited to the layer 318;

(6) a layer 322 of ZrO$_2$ with a thickness of about 10 to 25 nm deposited to the layer 320; and (7) a layer 324 of SiO$_2$ that is deposited using ion assist and with a thickness of about 5 to 15 nm deposited to the layer 322.

In one embodiment, the dipodal silane can be bis(trimethoxysilylpropyl)amine.

In one embodiment, the layer of coupling agent is formed of a composition that comprises cyclic azasilanes. In one particular embodiment, the layer of coupling agent is formed of N-n-butyl-aza-2,2-dimethoxy-silacyclopentane.

Furthermore, in a more general embodiment, the optical lens has an anti-reflective coating layered structure 311 that is formed with:

(1) a layer 312 of a first material with a first index of refraction, which is deposited using ion assist and with a thickness of about 5 to 100 nm, deposited to the layer 310;

(2) a layer 314 of a second material with a second index of refraction, with a thickness of about 40 to 50 nm, deposited to the layer 312;

(3) a layer 316 of the first material with the first index of refraction, which is deposited using ion assist and with a thickness about 10 to 20 nm, deposited to the layer 314;

(4) a layer 318 of the second material with the second index of refraction, with a thickness of about 50 to 70 nm, deposited to the layer 316;

(5) a layer 320 of the first material with the first index of refraction, which is deposited using ion assist and with a thickness of about 25 to 40 nm, deposited to the layer 318;

(6) a layer 322 of the second material with the second index of refraction, with a thickness of about 10 to 25 nm, deposited to the layer 320; and (7) a layer 324 of the first material with the first index of refraction, which is deposited using ion assist and with a thickness of about 5 to 15 nm, deposited to the layer 322.

In one embodiment, the first index of refraction L and the second index of refraction H satisfy a ratio of H/L>1. In other words, the value of the second index of refraction is greater than the value of the first index of refraction.

In one embodiment, the first material with first index of refraction comprises SiO$_2$, and the second material with second index of refraction comprises ZrO$_2$.

In a further aspect, the present invention relates to a method for making an anti-reflective coating to an optical surface of a mold. In various embodiments of the present invention as shown in FIGS. 3-6, such a method has the steps of:

providing a lens mold 302, 402, 502 or 602 having an optical surface 304, 404, 504 or 604;

forming a layer 306, 406, 506 or 606 of a super hydrophobic material with a thickness of about 30 to 40 nm over the optical surface 304, 404, 504 or 604, where the super hydrophobic material contains about 1.7-8.3% of dipodal silane by weight relative to the super hydrophobic material;

forming an anti-reflective coating layered structure 311, 411, 511 or 611 over the layer 306, 406, 506 or 606; and forming a layer 326, 426, 526 or 626 of a coupling agent that is deposited using dip coating or vapor deposition and with a monolayer thickness over the anti-reflective coating layered structure 311, 411, 511 or 611.

The step of forming an anti-reflective coating layered structure 311, 411, 511 or 611 over the layer 308, 408, 508 or 608 can be performed with the steps of:

(1) forming a layer 312, 412, 512 or 612 of a first material with a first index of refraction and a thickness of about 5 to 100 nm over the layer 306, 406, 506 or 606;

(2) forming a layer 314, 414, 514 or 614 of a second material with a second index of refraction and a thickness of about 40 to 50 nm, to the layer 312, 412, 512 or 612;

(3) forming a layer 316, 416, 516 or 616 of the first material with the first index of refraction and a thickness about 10 to 20 nm, to the layer 314, 414, 514 or 614;

(4) forming a layer 318, 418, 518 or 618 of the second material with second index of refraction and a thickness of about 50 to 70 nm, to the layer 316, 416, 516 or 616;

(5) forming a layer 320, 420, 520 or 620 of the first material with the first index of refraction and a thickness of about 25 to 40 nm, to the layer 318, 418, 518 or 618;

(6) forming a layer 322, 422, 522 or 622 of the second material with the second index of refraction and a thickness of about 10 to 25 nm, to the layer 320, 420, 520 or 620; and (7) forming a layer 324, 424, 524 or 624 of the first material with the first index of refraction and a thickness of about 5 to 15 nm, to the layer 322, 422, 522 or 622.

In one embodiment, the first index of refraction L and the second index of refraction H satisfy a ratio of H/L>1. In other words, the value of the second index of refraction is greater than the value of the first index of refraction.

In one embodiment, the first material with first index of refraction comprises $SiO_2$, and the second material with second index of refraction comprises $ZrO_2$.

In one embodiment as shown in FIG. 3, prior to the step of forming a layer 306 of a super hydrophobic material over the optical surface 304 a step of forming a layer 305 of $MgF_2$ with a thickness of less than about 45 nm over the optical surface 304 is performed such that the layer 305 is formed between the layer 306 and the optical surface 304.

Furthermore, in one embodiment as shown in FIG. 3, prior to the step of forming an anti-reflective coating layered structure 311 over the layer 306a step of forming a layer 310 of $SiO_2$ that is deposited without ion assist and with a thickness of 5 to 40 nm over the layer 306 is performed such that the layer 310 is formed between the layer 306 and the layer 312.

In embodiments as shown in FIGS. 5 and 6, prior to the step of forming an anti-reflective coating layered structure 511 or 611 over the layer 506 or 606, a step of forming a layer 510, 610 of $SiO_2$ that is deposited without ion assist and with a thickness of 5 to 40 nm over the layer 506, 606 is performed such that the layer 510, 610 is formed between the layer 506, 606 and the layer 512, 612.

In practicing the present invention according to the methods set forth above, each layer of $SiO_2$ is deposited using ion assist or without using ion assist.

In one embodiment, the dipodal silane can be bis(trimethoxysilylpropyl)amine.

In one embodiment, the layer of coupling agent is formed of a composition that comprises cyclic azasilanes. In one particular embodiment, the layer of coupling agent is formed of N-n-butyl-aza-2,2-dimethoxy-silacyclopentane.

In yet another aspect, the present invention relates to a mold with an optical surface having an anti-reflective coating that is transferable to an optical surface of a lens. In various embodiments as shown in FIGS. 3-6, such a mold has:

a layer 306, 406, 506 or 606 of a super hydrophobic material with a thickness of about 30 to 40 nm deposited over an optical surface 304, 404, 504 or 604 of the mold 302, 402, 502 or 602, where the super hydrophobic material contains about 1.7-8.3% of dipodal silane by weight relative to the super hydrophobic material;

an anti-reflective coating layered structure 311, 411, 511 or 611 deposited over the layer 306, 406, 506 or 606; and a layer 326, 426, 526 or 626 of a coupling agent that is deposited using dip coating or vapor deposition and with a monolayer thickness deposited over the anti-reflective coating layered structure 311, 411, 511 or 611.

As shown in FIGS. 3-6, the anti-reflective coating layered structure 311, 411, 511 or 611 has:

(1) a layer 312, 412, 512 or 612 of a first material with a first index of refraction and a thickness of about 5 to 100 nm deposited over the layer 306, 406, 506 or 606;

(2) a layer 314, 414, 514 or 614 of a second material with a second index of refraction and a thickness of about 40 to 50 nm, deposited to the layer 312, 412, 512 or 612;

(3) a layer 316, 416, 516 or 616 of the first material with the first index of refraction and a thickness about 10 to 20 nm, deposited to the layer 314, 414, 514 or 614;

(4) a layer 318, 418, 518 or 618 of the second material with the second index of refraction and a thickness of about 50 to 70 nm, deposited to the layer 316, 416, 516 or 616;

(5) a layer 320, 420, 520 or 620 of the first material with the first index of refraction and a thickness of about 25 to 40 nm, deposited to the layer 318, 418, 518 or 618;

(6) a layer 322, 422, 522 or 622 of the second material with the second index of refraction and a thickness of about 10 to 25 nm, deposited to the layer 320, 420, 520 or 620; and (7) a layer 324, 424, 524 or 624 of the first material with the first index of refraction and a thickness of about 5 to 15 nm, deposited to the layer 322, 422, 522 or 622.

The first index of refraction L and the second index of refraction H satisfy a ratio of H/L>1. In other words, the value of the second index of refraction is greater than the value of the first index of refraction.

In one embodiment, the first material with first index of refraction comprises $SiO_2$, and the second material with second index of refraction comprises $ZrO_2$.

In one embodiment as shown in FIG. 3, moreover, a layer 305 of $MgF_2$ that is ion assisted with a thickness of 5 to 100 nm is deposited over the optical surface 304 such that the layer 305 is formed between the layer 306 and the optical surface 304. Additionally, a layer 310 of $SiO_2$ is deposited without ion assist and with a thickness of 5 to 40 nm over the layer 306 such that the layer 310 is formed between the layer 306 and the layer 312.

In various embodiments as shown in FIGS. 5 and 6, alternatively, a layer 510, 610 of $SiO_2$ is deposited without ion assist and with a thickness of 5 to 40 nm over the layer 506, 606 such that the layer 510, 610 is formed between the layer 506, 606 and the layer 512, 612.

Each layer of $SiO_2$ in the anti-reflective coating layered structure is deposited using ion assist or without using ion assist.

The dipodal silane can be bis(trimethoxysilylpropyl) amine.

The layer of coupling agent is formed of a composition that comprises cyclic azasilanes. In various embodiments as shown in FIGS. 3-6, the layer of coupling agent is formed of N-n-butyl-aza-2,2-dimethoxy-silacyclopentane.

In a further aspect, the present invention relates to an optical lens. The optical lens has a lens body with an optical surface and an anti-reflective coating formed on the optical surface, where in various embodiments as shown in FIGS. 3-6, the anti-reflective coating has:

a layer 306, 406, 506 or 606 of a super hydrophobic material with a thickness of about 30 to 40 nm deposited over an optical surface 304, 404, 504 or 604 of the mold 302, 402, 502 or 602, where the super hydrophobic material contains about 1.7-8.3% of dipodal silane by weight relative to the super hydrophobic material;

an anti-reflective coating layered structure 311, 411, 511 or 611 deposited over the layer 306, 406, 506 or 606; and a layer 326, 426, 526 or 626 of a coupling agent that is deposited using vapor deposition and with a monolayer thickness deposited over the anti-reflective coating layered structure 311, 411, 511 or 611 and coupled to the optical surface.

The anti-reflective coating layered structure 311, 411, 511 or 611 is formed with:

(1) a layer 312, 412, 512 or 612 of a first material with a first index of refraction and a thickness of about 5 to 100 nm deposited over the layer 306, 406, 506 or 606;

(2) a layer 314, 414, 514 or 614 of a second material with a second index of refraction and a thickness of about 40 to 50 nm, deposited to the layer 312, 412, 512 or 612;

(3) a layer 316, 416, 516 or 616 of the first material with the first index of refraction and a thickness about 10 to 20 nm, deposited to the layer 314, 414, 514 or 614;

(4) a layer 318, 418, 518 or 618 of the second material with the second index of refraction and a thickness of about 50 to 70 nm, deposited to the layer 316, 416, 516 or 616;

(5) a layer 320, 420, 520 or 620 of the first material with the first index of refraction and a thickness of about 25 to 40 nm, deposited to the layer 318, 418, 518 or 618;

(6) a layer 322, 422, 522 or 622 of the second material with the second index of refraction and a thickness of about 10 to 25 nm, deposited to the layer 320, 420, 520 or 620; and (7) a layer 324, 424, 524 or 624 of the first material with the first index of refraction and a thickness of about 5 to 15 nm, deposited to the layer 322, 422, 522 or 622.

The first index of refraction L and the second index of refraction H satisfy a ratio of H/L>1. In other words, the value of the second index of refraction is greater than the value of the first index of refraction.

In various embodiments as shown in FIGS. 3-6, the first material with the first index of refraction comprises $SiO_2$, and the second material with the second index of refraction comprises $ZrO_2$.

In one embodiment as shown in FIG. 3, a layer 310 of $SiO_2$ is deposited without ion assist and with a thickness of 5 to 40 nm over the layer 306 such that the layer 310 is formed between the layer 306 and the layer 312.

In various embodiments as shown in FIGS. 5 and 6, a layer 510, 610 of $SiO_2$ is deposited without ion assist and with a thickness of 5 to 40 nm over the layer 506, 606 such that the layer 510, 610 is formed between the layer 506, 606 and the layer 512, 612.

In yet another aspect, the present invention relates to a coupling agent usable in lens making In one embodiment, the coupling agent comprises cyclic azasilanes. In one specific embodiment, cyclic azasilanes comprise N-n-butyl-aza-2,2-dimethoxy-silacyclopentane. It is noted that in use, cyclic azasilanes are applied in a solvent. For embodiments as shown in FIGS. 3-6, where $SiO_2$ is used as the first material with the first index of refraction, utilizing N-n-butyl-aza-2,2-dimethoxy-silacyclopentane as a coupling agent allows a surface bonding ring opening reaction without requiring water or heat, as shown in FIG. 2, resulting in much better bonding and making on-site AR lens formation a reality. This is much better than the process shown in FIG. 1, which requires high heat, among other things.

It is further noted that in practicing the present invention, the steps for each embodiment given above can be performed in sequence as given, or in different orders.

In a further aspect, the present invention relates to an optical lens. In one embodiment, the optical lens has a lens body with an optical surface, a hard coat layer over the optical surface, and an anti-reflective coating over the optical surface.

In one embodiment, the anti-reflective coating has a layer of a coupling agent with a monolayer thickness over the hard coat layer, an anti-reflective coating layered structure over the layer of a coupling agent, a first layer of $SiO_2$ that is deposited without using ion assist and with a thickness of about 5 to 40 nm over the anti-reflective coating layered structure over the layer of a coupling agent, and a layer of a super hydrophobic material with a thickness of about 30 to 40 nm over the first layer of $SiO_2$, where the super hydrophobic material contains about 1.7-8.3% of dipodal silane by weight relative to the super hydrophobic material. The dipodal silane can be bis(trimethoxysilylpropyl)amine.

The preceding description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A mold with an optical surface having an anti-reflective coating that is transferable to an optical surface of a lens, comprising:
   (a) a deposition layer of a fluoride or oxide material deposited to the optical surface;
   (b) a layer of a hydrophobic material over the deposition layer wherein the hydrophobic material consists essentially of a super hydrophobic material and a dipodal silane;
   (c) a first layer of $SiO_2$ that is deposited without using ion assist and with a thickness of about 5 to 40 nm deposited to the layer of hydrophobic material;
   (d) an anti-reflective coating layered structure deposited to the first layer of $SiO_2$;
   (e) a layer of a silane coupling agent that is deposited using vapor deposition and with a monolayer thickness deposited over the anti-reflective coating layered structure or by dip coating using a solution of silane coupling agent in an aprotic solvent, and
   (f) a scratch resistant hard coating,
   wherein the dipodal silane is different from the super hydrophobic material, and an amount of the dipodal silane is effective to prevent the anti-reflective coating layered structure from crazing.

2. The mold of claim 1, wherein the deposition layer is adapted to provide temporary adhesion between the mold surface and the hydrophobic layer such that all subsequent layers remain adherent to one another.

3. The mold of claim 1 wherein the deposition layer is formed of LiF, $MgF_2$, $CaF_2$, $SrF_2$, $BaF_2$, $LaF_3$, $CeF_3$, $HfF_4$, $NdF_4$, $SiO_2$, $ZrO_2$, $Al_2O_3$, $Cr_2O_3$, $HfO_2$, $In_2O3$, $Ta_2O_5$, $TiO_2$, $Y_2O_3$, or a combination of them.

4. The mold of claim 2 wherein the first deposition layer is formed of $MgF_2$ using ion assist and has a thickness of about 45 nm.

5. The mold of claim 1, wherein a thickness of the hydrophobic layer is about 30 to 40 nm and the amount of dipodal silane is 1.7-8.3% of said super hydrophobic material.

6. The mold of claim 1, wherein the anti-reflective coating layered structure comprises:
(a) a second layer of $SiO_2$ that is deposited using ion assist and with a thickness of about 5 to 100 nm to the first layer of $SiO_2$;
(b) a first layer of $ZrO_2$ with a thickness of about 40 to 50 nm deposited to the second layer of $SiO_2$;
(c) a third layer of $SiO_2$ that is deposited using ion assist and with a thickness of about 10 to 20 nm to the first layer of $ZrO_2$;
(d) a second layer of $ZrO_2$ with a thickness of about 50 to 70 nm deposited to the third layer of $SiO_2$;
(e) a fourth layer of $SiO_2$ that is deposited using ion assist and with a thickness of about 25 to 40 nm to the second layer of $ZrO_2$;
(f) a third layer of $ZrO_2$ with a thickness of about 10 to 25 nm deposited to the fourth layer of $SiO_2$; and
(g) a fifth layer of $SiO_2$ that is deposited using ion assist and with a thickness of about 5 to 15 nm to the third layer of $ZrO_2$.

7. The mold of claim 1, wherein the dipodal silane comprises bis(trimethoxysilylpropyl)amine, and the hydrophobic layer has a thickness of about 30 to 40 nm.

8. The mold of claim 1, wherein the layer of the silane coupling agent is a cyclic azasilane.

9. The mold of claim 8, wherein the layer of the silane coupling agent is formed of N-n-butyl-aza-2,2-dimethoxysilacyclopentane.

10. The mold of claim 1, wherein the anti-reflective coating layered structure comprises:
(a) a first layer of a first material with a first index of refraction, which is deposited using ion assist and with a thickness of about 5 to 100 nm, deposited to the first layer of $SiO_2$;
(b) a second layer of a second material with a second index of refraction, with a thickness of about 40 to 50 nm, deposited to the first layer of the first material;
(c) a third layer of the first material with the first index of refraction, which is deposited using ion assist and with a thickness of about 10 to 20 nm, deposited to the second layer of the second material;
(d) a fourth layer of the second material with the second index of refraction, with a thickness of about 50 to 70 nm, deposited to the third layer;
(e) a fifth layer of the first material with the first index of refraction, which is deposited using ion assist and with a thickness of about 25 to 40 nm, deposited to the fourth layer;
(f) a sixth layer of the second material with the second index of refraction, with a thickness of about 10 to 25 nm, deposited to the fifth layer; and
(g) a seventh layer of the first material with the first index of refraction, which is deposited using ion assist and with a thickness of about 5 to 15 nm, deposited to the sixth layer.

11. The mold of claim 10, wherein the first index of refraction L and the second index of refraction H satisfy a ratio of H/L>1.

12. The mold of claim 11, wherein the first material with the first index of refraction comprises $SiO_2$, and the second material with the second index of refraction comprises $ZrO_2$.

13. A mold with an optical surface having an anti-reflective coating that is transferable to an optical surface of a lens, comprising:
(a) a layer of a hydrophobic material deposited over an optical surface of the mold, wherein the hydrophobic material consists essentially of a super hydrophobic material and a dipodal silane;
(b) an anti-reflective coating layered structure deposited over the layer of the hydrophobic material;
(c) a layer of a coupling agent that is deposited with a monolayer thickness over the anti-reflective coating layered structure using vapor deposition or by dip coating using a solution consisting of a coupling agent in an aprotic solvent, and
(d) a scratch resistant hard coating, wherein the dipodal silane is different from the super hydrophobic material, and an amount of the dipodal silane is effective to prevent the anti-reflective coating layered structure from crazing.

14. The mold of claim 13, wherein the amount of the dipodal silane is about 1.7-8.3% of said super hydrophobic material by weight.

15. The mold of claim 13, wherein the anti-reflective coating layered structure comprises:
(a) a first layer of a first material with a first index of refraction and a thickness of about 5 to 100 nm deposited over the layer of the hydrophobic material;
(b) a second layer of a second material with a second index of refraction and a thickness of about 40 to 50 nm, deposited to the first layer;
(c) a third layer of the first material with the first index of refraction and a thickness of about 10 to 20 nm, deposited to the second layer;
(d) a fourth layer of the second material with the second index of refraction and a thickness of about 50 to 70 nm, deposited to the third layer;
(e) a fifth layer of the first material with the first index of refraction and a thickness of about 25 to 40 nm, deposited to the fourth layer;
(f) a sixth layer of the second material with the second index of refraction and a thickness of about 10 to 25 nm, deposited to the fifth layer; and
(g) a seventh layer of the first material with the first index of refraction and a thickness of about 5 to 15 nm, deposited to the sixth layer.

16. The mold of claim 15, wherein the first index of refraction L and the second index of refraction H satisfy a ratio of H/L>1.

17. The mold of claim 16, wherein the first material with the first index of refraction is $SiO_2$, and the second material with the second index of refraction is $ZrO_2$.

18. The mold of claim 14, further comprising a deposition layer of a fluoride or oxide material formed between the layer of the hydrophobic material and the optical surface.

19. The mold of claim 18, wherein the deposition layer is formed of LiF, $MgF_2$, $CaF_2$, $SrF_2$, $BaF_2$, $LaF_3$, $CeF_3$, $HfF_4$, $NdF_4$, $SiO_2$, $ZrO_2$, $Al_2O_3$, $Cr_2O_3$, $HfO_2$, $In_2O3$, $Ta_2O_5$, $TiO_2$, $Y_2O_3$, or a combination of them.

20. The mold of claim 15, further comprising a layer of $SiO_2$ that is deposited without ion assist and with a thickness of 5 to 40 nm and over the layer of the hydrophobic material such that the layer of $SiO_2$ is formed between the layer of the hydrophobic material and the first layer of the first material.

21. The mold of claim 17, wherein each layer of $SiO_2$ is deposited using ion assist or without using ion assist.

22. The mold of claim 13, wherein the dipodal silane comprises bis(trimethoxysilylpropyl)amine, and the hydrophobic layer has a thickness of about 30 to 40 nm.

23. The mold of claim 13, wherein the layer of the coupling agent is a cyclic azasilane.

24. The mold of claim 23, wherein the layer of the coupling agent is formed of N-n-butyl-aza-2,2-dimethoxy-silacyclopentane.

* * * * *